United States Patent
Schulze et al.

(10) Patent No.: US 7,618,755 B2
(45) Date of Patent: Nov. 17, 2009

(54) METHOD AND SYSTEM FOR AUTOMATICALLY DETECTING EXPOSED SUBSTRATES HAVING A HIGH PROBABILITY FOR DEFOCUSED EXPOSURE FIELDS

(75) Inventors: Uwe Schulze, Dresden (DE); Jens Krause, Dresden (DE); Rolf Seltmann, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 598 days.

(21) Appl. No.: 11/419,852

(22) Filed: May 23, 2006

(65) Prior Publication Data
US 2007/0048635 A1    Mar. 1, 2007

(30) Foreign Application Priority Data
Aug. 31, 2005  (DE) .................. 10 2005 041 311

(51) Int. Cl.
*G03F 9/00* (2006.01)
*G03C 5/00* (2006.01)
*G03B 27/54* (2006.01)
*G03B 27/42* (2006.01)
*G03B 27/72* (2006.01)

(52) U.S. Cl. .............................. 430/30; 355/53; 355/55; 355/67; 355/77; 382/145; 382/149

(58) Field of Classification Search .................. 430/30; 382/145, 149; 355/53, 55, 67, 77
See application file for complete search history.

(56) References Cited

U.S. PATENT DOCUMENTS

| 6,215,896 B1 | 4/2001 | Greig et al. .................. 382/149 |
| 7,245,356 B2 * | 7/2007 | Hansen ......................... 355/67 |

* cited by examiner

*Primary Examiner*—Christopher G Young
(74) *Attorney, Agent, or Firm*—Williams, Morgan & Amerson, P.C.

(57) ABSTRACT

By automatically estimating the focus status of individual substrates or lots on the basis of focus-specific tool information obtained from the exposure tool, such as tilt angle ranges used during the automatic focusing procedures, possible hot spot errors may be detected highly efficiently prior to releasing the substrates to a subsequent etch process. Consequently, yield losses may be reduced. Moreover, possible error sources for hot spot errors may be identified.

20 Claims, 2 Drawing Sheets

METHOD AND SYSTEM FOR AUTOMATICALLY DETECTING EXPOSED SUBSTRATES HAVING A HIGH PROBABILITY FOR DEFOCUSED EXPOSURE FIELDS

BACKGROUND OF THE INVENTION

1. Field of the Invention

The present invention relates to the field of fabricating semiconductor devices, and, in particular, to process control techniques for manufacturing processes, wherein an improved process control quality is achieved by detecting process failures on the basis of process data.

2. Description of the Related Art

Today's global market forces manufacturers of mass products to offer high quality products at a low price. It is thus important to improve yield and process efficiency to minimize production costs. This holds especially true in the field of semiconductor fabrication, since, here, it is essential to combine cutting edge technology with mass production techniques. It is, therefore, the goal of semiconductor manufacturers to reduce the consumption of raw materials and consumables while at the same time improve product quality and process tool utilization. The latter aspect is especially important since, in modern semiconductor facilities, equipment is required which is extremely cost-intensive and represents the dominant part of the total production costs. For example, in manufacturing modern integrated circuits, 500 or more individual processes may be necessary to complete the integrated circuit, wherein failure in a single process step may result in a loss of the complete integrated circuit. This problem is even exacerbated in that the size of substrates, on which a plurality of such integrated circuits are processed, steadily increases, so that failure in a single process step may entail the loss of a large number of products.

Therefore, the various manufacturing stages have to be thoroughly monitored to avoid undue waste of manpower, tool operation time and raw materials. Ideally, the effect of each individual process step on each substrate would be detected by measurement and the substrate under consideration would be released for further processing only if the required specifications were met. A corresponding process control, however, is not practical, since measuring the effects of certain processes may require relatively long measurement times, frequently ex situ, or may even necessitate the destruction of the sample. Moreover, immense effort, in terms of time and equipment, would have to be made on the metrology side to provide the required measurement results. Additionally, utilization of the process tool would be minimized since the tool would be released only after the provision of the measurement result and its assessment.

The introduction of statistical methods, also referred to as statistical process control (SPC), for adjusting process parameters significantly relaxes the above problem and allows a moderate utilization of the process tools while attaining a relatively high product yield. Statistical process control is based on the monitoring of the process output to thereby identify an out-of-control situation, wherein a causality relationship may be established to an external disturbance. After occurrence of an out-of-control situation, operator interaction is usually required to manipulate a process parameter so as to return to an in-control situation, wherein the causality relationship may be helpful in selecting an appropriate control action. Nevertheless, in total, a large number of dummy substrates or pilot substrates may be necessary to adjust process parameters of respective process tools, wherein tolerable parameter drifts during the process have to be taken into consideration when designing a process sequence, since such parameter drifts may remain undetected over a long time period or may not be efficiently compensated for by SPC techniques.

Recently, a process control strategy has been introduced and is continuously being improved allowing a high degree of process control, desirably on a run-to-run basis, with a moderate amount of a measurement data. In this control strategy, so-called advanced process control (APC), a model of a process or of a group of interrelated processes is established and implemented in an appropriately configured process controller. The process controller also receives information including pre-process measurement data and/or post-process measurement data, as well as information related, for instance, to the substrate history, such as type of process or processes, the product type, the process tool or process tools in which the products are to be processed or have been processed in previous steps, the process recipe to be used, i.e., a set of required sub-steps for the process or processes under consideration, wherein possibly fixed process parameters and variable process parameters may be contained, and the like. From this information and the process model, the process controller determines a controller state or process state that describes the effect of the process or processes under consideration on the specific product, thereby permitting the establishment of an appropriate parameter setting of the variable parameters of the specified process recipe to be performed with the substrate under consideration.

Thus, the APC controller may have a predictive behavior, which is typically referred to as model predictive control (MPC). Model predictive control schemes, although originally used for real-time control of continuous processes, may also be used for run-to-run control situations in that the continuous time parameter is replaced by a discrete process run index, wherein the controller is now configured to respond to substantially continuous disturbances, also referred to as process drifts, and to substantially step-wise disturbances, which may be considered as process shifts. Thus, run-to-run control may provide the potential of compensating for predictable, that is deterministic, disturbances such as process shifts and drifts.

Even though APC strategies may significantly contribute to yield improvement and/or enhanced device performance and/or a reduction on production costs, nevertheless a statistical probability exists that even process outputs obtained by using an APC technique may be outside of predefined value ranges, thereby resulting in yield loss. In high-volume production lines, even short delays between the occurrence of an out-of-control situation, indicating for instance an equipment failure, and its detection may lead to substantial monetary losses. Consequently, it may be advantageous to apply fault detection and classification (FDC) techniques in combination with other control strategies, such as APC and/or SPC.

For instance, one important application of run-to-run control is the monitoring of lithography processes, as the lithography process is one of the most critical processes during the fabrication of semiconductor devices. Moreover, the lithography process may typically provide enhanced control capabilities as the process is typically performed step-wise for each individual substrate, that is, a plurality of individual imaging steps are usually performed for each substrate, thereby enabling individual control of each single step. Consequently, across-wafer uniformity may be controlled by appropriately adapting process parameters of the individual imaging steps. In addition, the lithography has a somewhat unique position in that the process output of the lithography process may be assessed and the lithography process may be repeated when specific process margins are not achieved. On the other hand, lithography is a highly cost-intensive process and undue reprocessing of out-of-control substrates may substantially contribute to overall production costs. One critical aspect in the lithography process is, in addition to the appropriate alignment of the reticle pattern with respect to the wafer, the adjustment of the appropriate depth of focus, since the range for the available focus depth is related to the exposure wavelength and the numerical aperture, wherein, for a given numerical aperture, a reduced exposure wavelength leads to a reduced depth of focus. Thus, with ever decreasing feature sizes in modem integrated circuits, calling for shorter exposure wavelengths, the probability for grossly defocused exposure fields, which may be referred to as "hot spots," increases, thereby resulting in significant line width variations on the respective chips. However, standard inspection and overlay measurement techniques may not efficiently detect such hot spot errors, thereby significantly contributing to yield loss, since non-detected hot spot errors may prevent a corresponding wafer from being reworked and may also delay the detection of any failure mechanisms in the corresponding exposure tool or any other process tool related to the imaging process.

In view of the situation described above, there exists a need for an enhanced technique that enables a control strategy for a lithography process in which one or more of the problems identified above may be avoided or the effects thereof at least be significantly reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the detection of substrates having a high probability for including one or more defocused exposure fields, i.e., hot spots, in an automatic and fast manner, thereby providing the potential for efficiently identifying substrates that may have to be reworked prior to releasing the substrates to a subsequent etch process, in which defocused exposure fields may result in faulty semiconductor devices. For this purpose, automatically generated focus-specific machine data may be gathered and may be used to estimate a focus status of substrates processed in one or more photolithography tools, wherein the focus status may be available prior to a subsequent process step for permanently transferring the lithography pattern into the substrate.

According to one illustrative embodiment of the present invention, a method comprises performing an exposure process for one or more substrates in one or more lithography tools using an automated focus adjustment process on the basis of at least one focus parameter. The method further comprises communicating a current value of the at least one focus parameter to a fault detection module and determining in the fault detection module a current focus status of the one or more substrates on the basis of the current value and a statistical value related to the at least one focus parameter.

In accordance with another illustrative embodiment of the present invention, a fault detection system comprises an interface connectable to one or more lithography tools and a fault detection module connected to the interface for receiving focus-specific process data from the one or more lithography tools. The fault detection module is configured to determine for one or more substrates processed by the one or more lithography tools, prior to releasing the one or more substrates for an etch process, a current focus status of the one or more substrates on the basis of the focus-specific process data. Furthermore, the fault detection system comprises a focus status indicator connected to the fault detection module and configured to indicate a current focus status of the one or more substrates.

BRIEF DESCRIPTION OF THE DRAWINGS

The invention may be understood by reference to the following description taken in conjunction with the accompanying drawings, in which like reference numerals identify like elements, and in which.

Figure 1A:
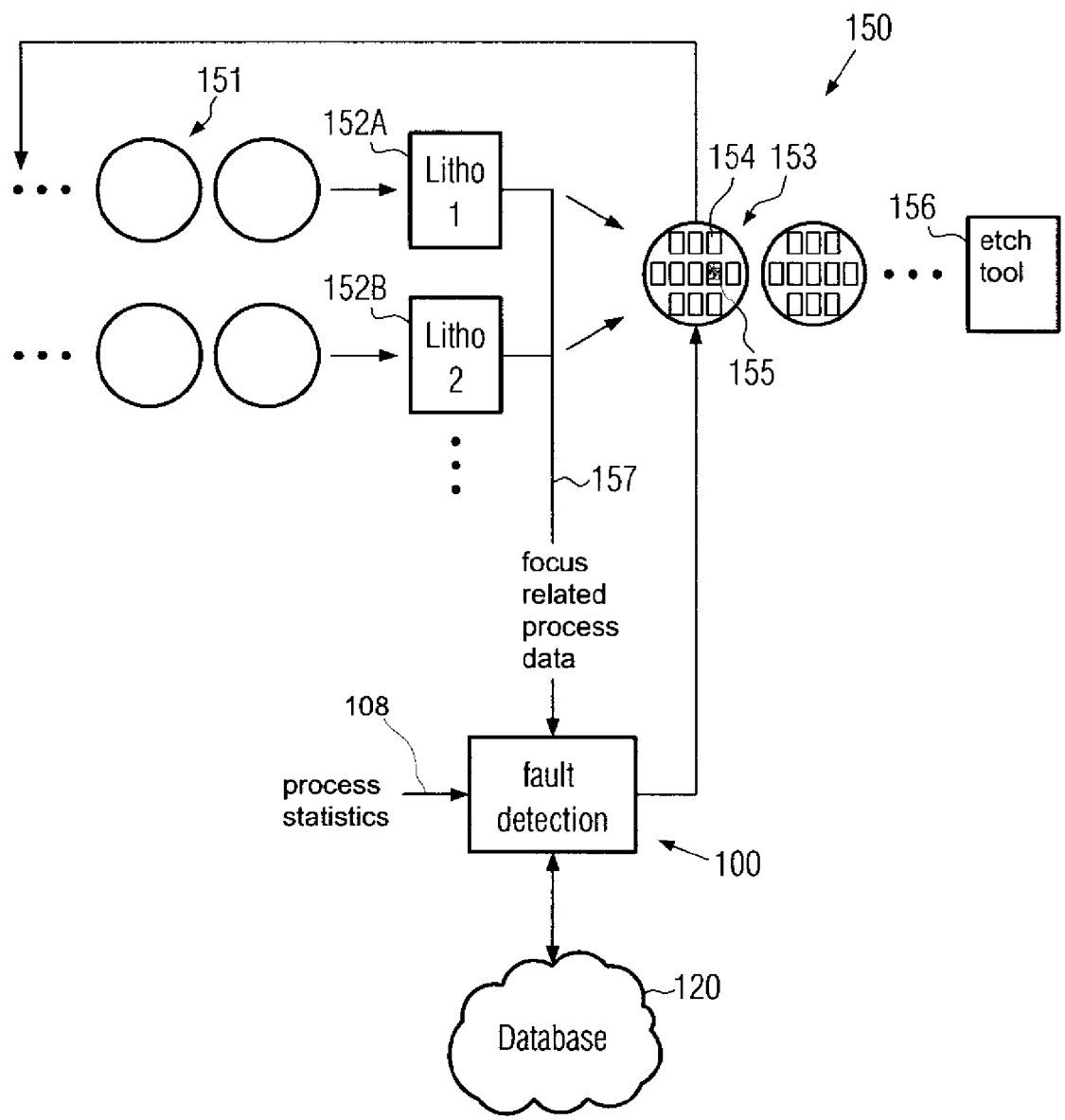
FIG. 1a schematically illustrates a manufacturing environment including a plurality of lithography tools and a fault detection system including a fault detection module for indicating a current focus status of one or more substrates that have been processed by the lithography tools in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is based on the concept that highly efficient APC strategies may be efficiently enhanced by additionally providing effective fault detection algorithms and techniques which enable a rapid detection of process failures and which may allow the classification of the occurred faults, thereby providing an efficient means for identifying a possible error source. One essential process in the manufacturing of semiconductor devices is the lithography, since exposure processes at the various device levels represent the major part of the overall production costs and also provide the potential for compensating for across-substrate non-uniformities and also rectify exposure-specific errors prior to permanently transferring such exposure-specific errors into the semiconductor structure in the subsequent etch process. As previously explained, with ever-decreasing exposure wavelengths, which may presently be at approximately 190 nm for critical lithography processes, such as the gate electrode lithography, and with the prospect of still further reduced wavelengths in the near future, the requirements with respect to appropriately focusing each exposure field are also becoming more stringent. In an exposure process, therefore, highly complex and automated procedures are performed to appropriately align and focus the substrate to be exposed. The alignment and focusing procedure is usually performed individually for each exposure field and may thus require different alignment and focusing values of the respective parameters. For example, the presence of a tiny particle on the backside of a substrate may lead to a different height of the substrate surface in the vicinity of the particle compared to other substrate regions, thereby possibly creating a significantly different set of values for the respective focus adjustment parameters compared to substantially non-concerned substrate regions. Focus-specific process data created during the focusing process may be efficiently used as a measure for a probability of the occurrence of a hot spot, i.e., a defocused area on a substrate, wherein the availability of the corresponding process data immediately after or even during the exposure process of the respective substrate may allow a fast and efficient evaluation of the current focus status of the substrate. Depending on the process strategy, highly efficient statistical values may be generated on the basis of a plurality of substrates to significantly enhance the "reliability" of the correspondingly estimated focus status. Moreover, by appropriately correlating the focus status of respective substrates with other process- and tool-specific information, possible error sources creating a hot spot error may be identified more efficiently compared to conventional techniques, since in conventional techniques even the detection of a hot spot error may be significantly delayed when standard inspection and overlay sampling tests are performed.

Figure 1B:
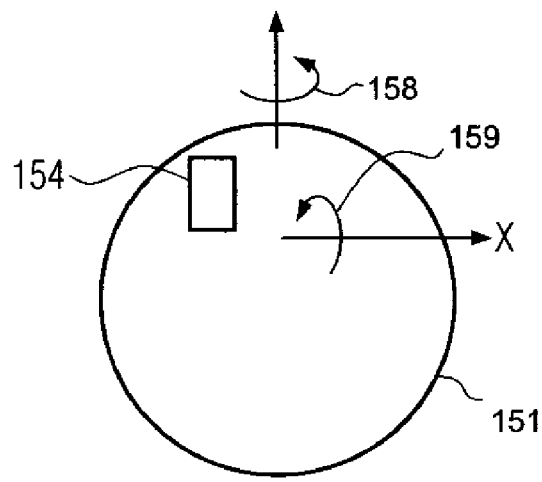
FIG. 1b schematically shows a top view of a substrate including an exposure field, wherein focus-specific parameters are indicated that may be used during the automatic focusing procedure prior to an actual exposure process.
Figure 1C:
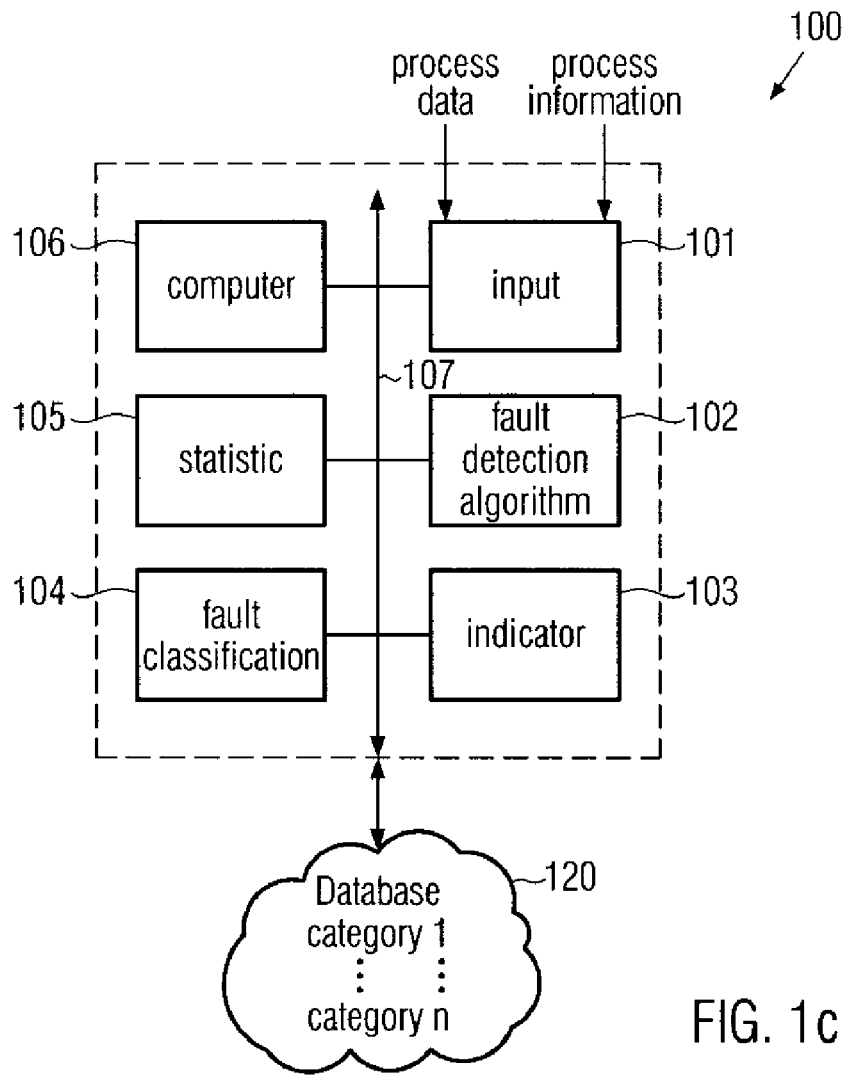
FIG. 1c schematically shows a fault detection system in more detail according to other illustrative embodiments of the present invention.

With reference to FIGS. 1a-1c, illustrative embodiments of the present invention will now be described in more detail. FIG. 1a schematically shows a manufacturing environment 150 for performing one or more manufacturing processes during the fabrication of semiconductor devices. The manufacturing environment 150 comprises one or more lithography tools 152a, 152b, which may represent the same or different types of lithography tools that are operated in accordance with predefined process recipes and with specific photomasks, i.e., reticles, which are required for transferring a specified pattern onto a specified device layer of a plurality of substrates 151. Moreover, a plurality of substrates 153 are illustrated which have recently been processed by the lithography tools 152a, 152b and for which a current focus status is to be estimated prior to releasing the substrates 153 to an etch process performed in an etch tool 156 to permanently transfer the optically created pattern in a plurality of exposure fields 154 into an underlying device layer. Thus, the present invention is applicable to exposure processes used in forming devices, such as transistors and the like to be formed in a device level, as well as exposure processes used to form other features at different levels, e.g., a via etch in a dielectric layer, an STI trench, etc. As previously explained, during the exposure process in the lithography tools 152a, 152b, one or more exposure fields on one or more substrates 153 may have been exposed in a substantially defocused condition, thereby typically resulting in faulty devices after the completion of the manufacturing sequence for the substrates 153. In FIG. 1a, a corresponding defocused area, also referred to as a hot spot 155, is shown in one of the substrates 153. There may be a plurality of reasons for the occurrence of the hot spot 155, such as particles on the substrate and/or the substrate holder, wherein especially the backside polishing of substrates may result in increased backside particle contamination, focus adjustment algorithm insufficiencies, reticle layout failures, reticle contamination, inhomogeneities of underlying substrate layers, and the like.

The manufacturing environment 150 further comprises a fault detection system 100, which may include an interface 157 that is configured to provide a connection to the lithography tools 152a, 152b to communicate focus-related process data from the lithography tools 152a, 152b to the fault detection system 100. Moreover, the fault detection system 100 may comprise a further interface 108 for receiving statistical information regarding the focus-related process data. Hereby, the focus-related statistical data received by the interface 108 may represent a single threshold value or may include process data of previously processed substrates, thereby enabling the fault detection system 100 to determine any appropriate statistical value required for a reliable estimation of the focus-related process data obtained from the newly processed substrates 153. Moreover, the fault detection system 100 may be connected to a database 120, which may contain further process-specific information, such as the identification of the lithography tools 152a, 152b that are actually used for processing a specific one of the substrates 153, the device layer to be formed during the lithography process performed by the individual tools 152a, 152b, information on any pre-exposure processes, such as the identity of the resist coating station used, and the like. The database 120 may be organized in accordance with specified categories so as to enable the highly efficient classification of current focus statuses estimated for the one or more substrates 153. For example, the database 120 may also be accessed by a corresponding APC controller (not shown) which may be operated to control the actual exposure process in the individual tools 152a, 152b, wherein the variable parameter values of the specific exposure recipes may be established on the basis of process data and previously used manipulated variables belonging to an individual category of the database 120. Thus, the fault detection system 100 may use substantially the same process data hierarchy as may also be used by the corresponding APC controller. In other embodiments, however, a more or less detailed categorization of process-specific information may be used in the database 120.

During a manufacturing sequence performed in the manufacturing environment 150, the substrate 151 may be supplied to the environment 150 by means of appropriate substrate transportation means, wherein a supervising manufacturing execution system (not shown) may be provided which may control the entire process flow in the environment 150. Thus, the substrates 151 may represent a group of substrates, such as a lot, receiving substantially the same process recipe, i.e., a specific mask pattern is to be transferred into a corresponding resist layer previously formed on the substrates 151. In other cases, the substrates 151 may receive different types of photomask patterns as they may represent different types of semiconductor devices or may represent the same type of semiconductor devices at a different point of the overall manufacturing process. In some illustrative embodiments, respective substrate-specific information, such as process history, for instance regarding the formation of the resist layer, any other pre-exposure processes, such as resist baking, and the like, may be stored in the database 120. The substrates 151 may then be supplied to the lithography tools 152a, 152b in accordance with process requirements, such as the availability of the individual tools 152a, 152b, the specific exposure wavelength used in various tools, and the like. Corresponding information, i.e., which lithography tool 152a, 152b is selected to process which substrate 151, may also be entered into the database 120 and may therefore be available for the fault detection system 100. After being received in one of the lithography tools 152a, 152b, a respective substrate is then subjected to an automated alignment procedure and a subsequent focusing process. During the focusing process, the lithography tool estimates, on the basis of specific algorithms, whether or not the respective portion of the substrate is within a valid range so as to obtain substantially well-focused resist features.

FIG. 1b schematically shows a top view of one of the substrates 151 during the focusing procedure for subsequently generating one of the exposure fields 154. Based on additional optical means, such as lasers and the like, and/or on the basis of the inherent optical system, the distance of the exposure field 154 with respect to the focus plane of the lithography tool is adjusted. For this purpose, the substrate 151 may be tilted with respect to specified directions, such as an x-direction 159 and a y-direction 158, in order to automatically estimate, on the basis of optical data gathered for different values of the respective tilt angles, an optimum focused state for the exposure field 154. During this focusing procedure, therefore, the respective tilt angles in the x- and y-direction may be varied in relation to the measurement results obtained for the various tilt angles, thereby creating a tilt angle range required for obtaining a focus position that is considered appropriate by the automated focusing algorithm. Consequently, the tilt angle ranges used during the focusing process for the plurality of exposure fields 154 of the substrate 151 may contain information on the "accuracy" and thus on the quality of the focusing process, as, for instance, a large tilt angle range in one or more of the specified directions may indicate a certain amount of uncertainty for evaluating an "optimum" focus position. The corresponding focusing process is performed for each of the exposure fields 154, wherein the complete set of focus-related information, i.e., in one particular embodiment, the respective tilt angle range is available after processing of the respective substrate 151.

In one illustrative embodiment, predefined substrate positions may be selected in advance, from which corresponding tilt angle range data or other focus-related data may be gathered to estimate the current focus status of the respective substrate. For example, exposure positions at the substrate edge may be excluded due to enhanced variations and non-uniformities at the wafer edge. The corresponding focus-specific data may, immediately after the completion of the exposure process or after the completion of the individual focusing processes, be delivered to the fault detection system 100 via the interface 157. In some illustrative embodiments, the corresponding data may be delivered after the completion of the processing of a group of substrates 151, such as the substrates 153, however, prior to the processing of the substrates 153 in the etch tool 156.

On the basis of the focus-related process data and a statistically relevant value, which may be obtained through the interface 108, or which may be determined on the basis of the focus-related process data, for instance, by averaging a plurality of previously obtained process information and the like, the fault detection system 100 calculates a current focus status of the substrates 153 and identifies a specific one of the substrates 153 as having a high risk for including the hot spot 155. Consequently, the corresponding substrate 153 may be flagged as a substrate to be reworked and may be separated from the remaining substrates 153, which are assessed as having a valid current focus status and which may proceed with the further processing, which may include other inspection and measurement procedures, in which further error detecting mechanisms may be applied to identify any further substrates that may need to be reworked. In one illustrative embodiment, therefore, the current focus status of each of the substrates 153 or of a group of substrates 153 is determined substantially immediately after the completion of the exposure process and prior to any further substrate processing, thereby increasing throughput and tool availability of post-exposure process sequences.

In one illustrative embodiment, the focus-related process data may be based on the following parameters: $MAX\_TILT\_RX(i)$ . . . represents the maximum intrafield tilt of a substrate having the index "i" with respect to the x-direction; $MAX\_TILT\_RY(i)$ . . . represents the maximum intrafield tilt of the substrate with index "i" with respect to the y-direction; $STDV\_TILT\_RX(i)$ . . . may represent the standard deviation of the intrafield tilt of the substrate with index "i" in the x-direction; and $STDV\_TILT\_RY(i)$ . . . may represent the standard deviation of the intrafield tilt of the substrate with index "i" in the y-direction. These parameters may advantageously be used for the substrate-based evaluation of the probability of having produced a hot spot during a preceding lithography process.

The following parameters may be used in assessing the current focus status of groups or lots of substrates and also for determining a statistical value of high significance for estimating the current focus status of individual substrates or groups of substrates: $MAX\_PX(j)$ . . . represents the average of the substrate-based maximum intrafield tilt $MAX\_TILT\_RX(i)$ of the group or lot with index "j"; $MAX\_TY(j)$ . . . represents the average of the substrate-based maximum intrafield tilt $MAX\_TILT\_RY(i)$ of the group with index "j"; $STDV\_PX(j)$ . . . represents the average of the substrate-based standard deviation of the intrafield tilt $STDV\_TILT\_RX(i)$ of the group with index "j"; and $STDV\_PY(j)$ . . . represents the average of the substrate-based standard deviation of the intrafield tilt $STDV\_TILT\_RY(i)$ of the group with index "j."

Moreover, in one illustrative embodiment, the following parameters for statistically significant values may be defined: $MAX\_PX$ . . . represents the average of the above-defined group-specific values $MAX\_PX(j)$ of the currently processed group of substrates 153 and of preceding processed groups of substrates, wherein a number "k" of lots may be taken into consideration, wherein "k" may appropriately be selected; MAX_PY . . . represents the average of the MAX_PY(j) for the currently processed group and the last "k" groups; STDV_PX . . . represents the average of the corresponding standard deviations STDV_PX(j) of the currently processed group and the last "k" groups; and STDV_PY . . . represents the average of the respective standard deviations STDV_PY (j) of the currently processed group and the last "k" groups.

Based on the above-defined parameters, various criteria may be established to determine whether a current focus status is an invalid status or not. In one illustrative embodiment, a threshold may be set, for instance in advance or in a dynamic manner so that the threshold value may be updated on the basis of the obtained "quality" of the hot spot detection, and the threshold may then be compared with an appropriately defined value obtained from the above-described parameters. In one illustrative embodiment, a threshold value, indicated as Fh, may be defined in the range of approximately 0.3-0.7, and advantageously in a range of approximately 0.4-0.5, which may be compared with corresponding values representing the focus-related process data on a group or lot basis. For instance, the following inequations may be established so as to quantitatively estimate the probability of the occurrence of the hot spot 155:

$$1-MAX\_PX/MAX\_PX(j) \leq Fh$$

$$1-MAX\_PY/MAX\_PY(j) \leq Fh$$

$$1-STDV\_PX/STDV\_PX(j) \leq Fh$$

$$1-STDV\_PY/STDV\_PY(j) \leq Fh$$

Consequently, depending on the process strategy, if one or more of the above conditions is violated, the respective group of substrates may be estimated to have an invalid current focus status, thereby identifying this substrate or group of substrates as substrates to be reworked. As may be seen from the above conditions, if the respective currently obtained process data are significantly greater than the corresponding associated statistical values, the ratio of the statistical value and the corresponding current process data becomes rather small and thus the left-hand side of the inequations no longer complies with the predefined threshold value. On the other hand, if the currently obtained process data, i.e., the data characterizing the previously processed substrates 153 as a group, remains in the vicinity of the associated statistical value, the left-hand side of the above inequations remains less than the threshold value, thereby indicating a valid current focus status.

Similarly, a substrate-based estimation of the current focus data may be accomplished, for instance by means of the following conditions:

$$1-MAX\_PX/MAX\_TILT\_RX(i) \leq Fh$$

$$1-MAX\_PY/MAX\_TILT\_RY(i) \leq Fh$$

$$1-STDV\_PX/STDV\_TILT\_RX(j) \leq Fh$$

$$1-STDV\_PY/STDV\_TILT\_RY(j) \leq Fh$$

Thus, the probability for the occurrence of a hot spot may also be efficiently determined on the basis of individual substrates, while it is to be appreciated that other appropriate algorithms and comparison criteria may be established.

FIG. 1c schematically shows the fault detection system 100 according to further illustrative embodiments, wherein the focus-specific process data may be even more efficiently used to enhance the hot spot detection and/or provide a fault classification for identifying possible error sources causing hot spot errors. The fault detection system 100 may comprise an input section 101, which receives the focus-related process data and which may also receive other process information, such as tool identification information, process recipe relevant information, substrate identification and history information, and the like. The input section 101 may communicate with one or more of other functional blocks in the fault detection system 100 via a communication bus 107, to which the database 120 is also connected. In one illustrative embodiment, the database 120 is organized in correspondence with a specified data structure so that information stored therein or retrieved therefrom is classified into specific categories, which are appropriately set so as to enhance the efficiency of the focus status evaluation and/or a fault classification. For instance, substrates processed by the same lithography tool 152a, 152b and requiring the same process recipe may be considered as belonging to the same category. In other examples, the resolution for a possible error source detection may be increased by more finely defining the categories, for instance by also taking into consideration the reticle used in a specific lithography tool, and/or by taking into consideration any pre-process information, such as the identity of the resist coating tool or any other pre-exposure treatment tool and the like. For example, a contamination of a specific resist coating tool may result in a non-uniformity of the resist layer, which in turn may significantly affect the exposure process in a highly localized manner. Consequently, by tracking various process "threads" by means of specifically defined categories, possible error sources may be identified more efficiently. Thus, after receiving the process data and possibly any process information related thereto and storing the same in the database 120, a section 102 representing a fault detection module may estimate the current focus status of one or more of the substrates 153 on the basis of an appropriate algorithm, for instance as is defined above, wherein the fault detection module 102 may communicate via the communication bus 107 with a statistic module 105 and a comparator module 106 which, in combination, may provide appropriate statistical values and comparison criteria for finally estimating the current focus status.

Moreover, the system 100 may comprise an indicator 103, which may represent any appropriate means for indicating the currently determined focus status of a specific substrate or a specific group of substrates. For example, the indicator 103 may communicate with the database 120 so as to store therein a corresponding current focus status that may then be retrieved from any other control system, such as an APC controller, which may use the current focus status for more efficiently controlling the lithography tools 152a, 152b. In other cases, a supervising manufacturing execution system may query the database 120 so as to identify any substrates or group of substrates that have to be reworked prior to being released to a subsequent process, such as an etch process in the etch tool 156. Moreover, the supervising control system may provide the required resources that may be necessary to separate any substrate identified as having an invalid focus status from the remaining substrates and to provide tool availability for the subsequent reworking of these substrates. In other cases, the indicator 103 may be configured to inform an operator on the occurrence of an invalid focus status of one of the substrates 153 or a group of substrates.

In one illustrative embodiment, the system 100 further comprises a fault classification module 104, which may be configured to determine the probability of various components and processes within the manufacturing environment 150 as representing a potential source for creating hot spot errors. For instance, the fault classification module 104 may access the database 120 and may compare substrates of the various categories in view of their current focus status. For example, if in one category a moderately high number of invalid focus statuses is detected, and in a different category, which may comprise the same items except for one differing item, a low number of invalid focus statuses is recognized, the fault classification module 104 may identify the differing item, for example, a different reticle used, a different exposure tool used, a different pre-exposure process tool used and the like, as a possible source of hot spot errors. Thus, the fault classification module 104 may create a corresponding key number or any other appropriate indication that quantifies the corresponding "hot spot error creation potential" of the various components, i.e., items of the respective categories, within the manufacturing environment 150. Corresponding fault classification values may then be provided to the indicator 103 or may be stored in the database 120 for further use in other control strategies. It should be appreciated that the fault classification module 104 may not necessarily operate on a digital value, i.e., yes/no conditions, of the current focus status, i.e., the fault classification module 104 may use "continuous" focus status values so that process situations may also be taken into consideration, in which the current focus status is close to the threshold, thereby enabling a more efficient evaluation of the individual components with respect to their hot spot error creation potential.

As a result, the present invention provides an enhanced technique for identifying substrates having a high probability for hot spot errors created during an exposure process, wherein a fast response time may allow the identification of substrates to be reworked due to hot spot errors immediately after the exposure process, thereby reducing yield loss and enhancing tool utilization. For this purpose, focus-related data gathered during the automated focusing process in the lithography tools are used which, in one illustrative embodiment, represent the tilt angle ranges used during the adjustment of the focus position, which may therefore be available immediately after completion of the exposure process and may thus enable an automated determination of the current focus status. Moreover, on the basis of appropriate algorithms for numerically calculating a focus-specific status value, other control activities may be enhanced and an efficient fault classification may also be established to identify components and processes as potential hot spot error sources or evaluate the relevance of a detected error source. In addition, the dynamic hot spot error tracking is substantially not affected by tool and/or setup changes in the respective exposure tools, as such changes will be represented by the statistical values obtained from a plurality of previously processed substrates. In some illustrative embodiments, an exponentially weighted moving average may be used to provide respective statistical values, such as a threshold value, or the nominator in the above-specified inequations, thereby efficiently adapting the current status algorithm to any changes in hardware or setup of the exposure tools. Moreover, by providing the system with an appropriate data structure in the form of appropriately defined categories, a high degree of error coverage of the manufacturing environment may be obtained and a high degree of compatibility with other control strategies may also be achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
performing an exposure process for one or more substrates in one or more lithography tools using an automated focus adjustment process on the basis of at least one focus tilt parameter;
communicating a current value of said at least one focus tilt parameter to a fault detection module; and
determining in said fault detection module a current focus fault status of said one or more substrates on the basis of said current value and a statistical value related to said at least one focus tilt parameter.

2. The method of claim 1, further comprising comparing said current focus status with a reference criterion and indicating an invalid focus status when said reference criterion is not fulfilled.

3. The method of claim 1, wherein said at least one focus tilt parameter comprises a range of tilt angles with respect to at least one predefined direction that is used for focusing said one or more substrates.

4. The method of claim 3, wherein said at least one focus tilt parameter comprises for each of said one or more substrates a first maximum tilt angle with respect to a first predefined direction and a second maximum tilt angle with respect to a second predefined direction.

5. The method of claim 1, wherein determining said current focus status comprises calculating a standard deviation of said at least one focus tilt parameter for each of said one or more substrates.

6. The method of claim 1, wherein said current focus fault status is commonly determined for a plurality of substrates processed in said one or more lithography tools using an averaged current value obtained from a respective current value of each of the plurality of substrates.

7. The method of claim 1, further comprising communicating process information associated with said exposure process to said fault detection module and determining said current focus fault status on the basis of said process information.

8. The method of claim 7, wherein said process information associated with each of said one or more substrates at least comprises at least two items represented by an identification of said one or more lithography tools and an identification of the current device layer to be imaged onto said one or more substrates, and wherein a set of items defines a specific category.

9. The method of claim 8, wherein said current focus fault status is individually determined for each predefined category, and wherein said statistical value is determined individually for each category on the basis of data related to a corresponding category.

10. The method of claim 2, further comprising automatically identifying a substrate having an invalid focus fault status as a substrate to be reworked prior to releasing said substrate to a post-exposure processing for substrates having a valid focus fault status.

11. The method of claim 9, further comprising comparing, in said fault detection module, invalid focus fault statuses belonging to different categories and determining a probability for an error source of an invalid focus fault status on the basis of a result of said comparison.

12. A fault detection system, comprising:
an interface connectable to one or more lithography tools;
a fault detection module connected to said interface for receiving focus tilt process data from said one or more lithography tools, said fault detection module configured to determine, for one or more substrates processed by said one or more lithography tools prior to releasing said one or more substrates for an etching process, a current focus fault status of said one or more substrates on the basis of said focus tilt process data; and
a focus status indicator connected to said fault detection module and configured to indicate a current focus fault status for said one or more substrates.

13. The fault detection system of claim 12, wherein said fault detection module comprises a comparator unit configured to compare said current focus fault status with a reference criterion and to identify an invalid focus fault status when said reference criterion is not fulfilled.

14. The fault detection system of claim 12, wherein said focus tilt process data comprises a tilt angle with respect to at least one predefined direction that is used for focusing said one or more substrates.

15. The fault detection system of claim 14, wherein said focus tilt process data comprises for each of said one or more substrates a first maximum tilt angle with respect to a first predefined direction and a second maximum tilt angle with respect to a second predefined direction.

16. The fault detection system of claim 12, wherein said fault detection module comprises a calculation unit configured to calculate a standard deviation of at least one focus tilt parameter contained in said focus tilt process data for each of said one or more substrates.

17. The fault detection system of claim 12, wherein said fault detection module is further configured to receive process information associated with said exposure process and to determine said current focus fault status on the basis of said process information.

18. The fault detection system of claim 17, wherein said process information associated with each of said one or more substrates at least comprises at least two items represented by an identification of said one or more lithography tools and an identification of the current device layer to be imaged onto the one or more substrates, and wherein a set of items defines a specific category, the system further comprising a database connected to said fault detection module and having a data structure according to one or more of said specific categories.

19. The fault detection system of claim 18, wherein said fault detection module is further configured to determine said current focus fault status individually for each predefined category, and to determine a statistical value individually for each category on the basis of said focus tilt process data related to a corresponding category.

20. The fault detection system of claim 19, further comprising a fault classification module configured to compare invalid focus fault statuses belonging to different categories and determine a probability for an error source of an invalid focus fault status on the basis of a result of said comparison.

* * * * *